(12) United States Patent
Fujii

(10) Patent No.: US 11,524,893 B2
(45) Date of Patent: Dec. 13, 2022

(54) METHOD FOR MANUFACTURING MICROMECHANICAL STRUCTURES IN A DEVICE WAFER

(71) Applicant: MURATA MANUFACTURING CO., LTD., Nagaokakyo (JP)

(72) Inventor: Hidetoshi Fujii, Espoo (FI)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 317 days.

(21) Appl. No.: 17/003,703

(22) Filed: Aug. 26, 2020

(65) Prior Publication Data

US 2021/0002131 A1 Jan. 7, 2021

Related U.S. Application Data

(63) Continuation of application No. 15/981,327, filed on May 16, 2018, now Pat. No. 10,807,863.

(30) Foreign Application Priority Data

May 30, 2017 (FI) .................................. 20175485

(51) Int. Cl.
*B81C 1/00* (2006.01)

(52) U.S. Cl.
CPC ...... *B81C 1/00619* (2013.01); *B81C 1/00587* (2013.01); *B81B 2201/0235* (2013.01);
(Continued)

(58) Field of Classification Search
CPC ............ B81C 1/00619; B81C 1/00587; B81C 2201/0112; B81C 2201/0132;
(Continued)

(56) References Cited

U.S. PATENT DOCUMENTS 5,719,073 A 2/1998 Shaw et al.
7,052,623 B1 5/2006 Becker et al.
(Continued)

FOREIGN PATENT DOCUMENTS

EP  2 267 461 A1  12/2010
JP  2002-200598 A  7/2002
(Continued)

OTHER PUBLICATIONS

Notice of Reasons for Refusal issued in corresponding Japanese Patent Application No. 2018-100907, dated Jul. 2, 2019. Submitted in parent U.S. Appl. No. 15/981,327.
(Continued)

*Primary Examiner* — Steven B Gauthier
*Assistant Examiner* — Candice Chan
(74) *Attorney, Agent, or Firm* — Squire Patton Boggs (US) LLP

(57) ABSTRACT

The disclosure relates to a method for manufacturing recessed micromechanical structures in a MEMS device wafer. First vertical trenches in the device wafer define the horizontal dimensions of both level and recessed structures. The horizontal face of the device wafer and the vertical sidewalls of the first vertical trenches are then covered with a self-supporting etching mask which is made of a self-supporting mask material, which is sufficiently rigid to remain standing vertically in the location where it was deposited even as the sidewall upon which it was deposited is etched away. Recess trenches are then etched under the protection of the self-supporting mask. The method allows a spike-preventing aggressive etch to be used for forming the recess trenches, without harming the sidewalls in the first vertical trenches.

10 Claims, 8 Drawing Sheets

(52) U.S. Cl.
CPC ............. *B81B 2201/0242* (2013.01); *B81C 2201/0112* (2013.01); *B81C 2201/0132* (2013.01); *B81C 2201/0133* (2013.01); *B81C 2201/0142* (2013.01); *B81C 2201/0198* (2013.01); *B81C 2201/053* (2013.01)

(58) Field of Classification Search
CPC .... B81C 2201/0133; B81C 2201/0142; B81C 2201/0198; B81C 2201/053; B81B 2201/0235; B81B 2201/0242
See application file for complete search history.

(56) References Cited

U.S. PATENT DOCUMENTS

| | | | |
|---|---|---|---|
| 2002/0005976 | A1 | 1/2002 | Behin |
| 2005/0037531 | A1 | 2/2005 | Kouma |
| 2005/0287815 | A1 | 12/2005 | Lai et al. |
| 2009/0025477 | A1 | 1/2009 | Pilchowski et al. |
| 2010/0326191 | A1* | 12/2010 | Foster ............... G01C 19/5719 73/514.32 |
| 2011/0244687 | A1 | 10/2011 | Oohara et al. |

FOREIGN PATENT DOCUMENTS

| | | |
|---|---|---|
| JP | 2002-228678 A | 8/2002 |
| JP | 2012-157941 A | 8/2012 |
| JP | 2014-098705 A | 5/2014 |
| KR | 20070106358 A | 11/2007 |
| WO | 03/025982 A1 | 3/2003 |
| WO | 2015/177694 A1 | 11/2015 |
| WO | 2016/185312 A1 | 11/2016 |

OTHER PUBLICATIONS

European Search Report corresponding to European Appln. No. 18 17 4480, dated Oct. 25, 2018. Submitted in parent U.S. Appl. No. 15/981,327.

Finnish Search Report dated Mar. 21, 2018, corresponding to Finnish Patent Appln. No. 20175485. Submitted in parent U.S. Appl. No. 15/981,327.

* cited by examiner

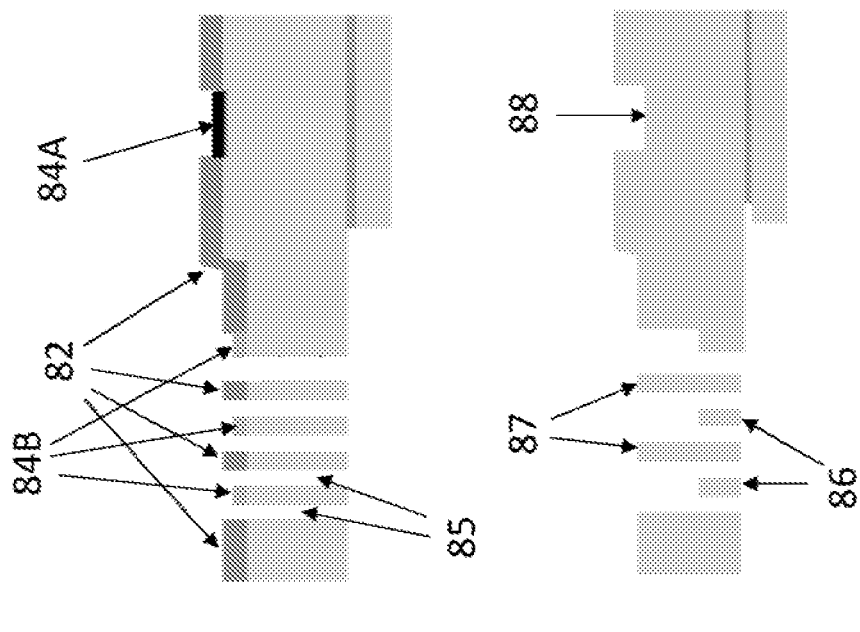

METHOD FOR MANUFACTURING MICROMECHANICAL STRUCTURES IN A DEVICE WAFER

CROSS REFERENCE TO RELATED APPLICATION

This application is a Continuation of co-pending U.S. patent application Ser. No. 15/981,327, filed on May 16, 2018, which claims priority under 35 U.S.C. § 119 to Finnish Patent Application No. 20175485, filed on May 30, 2017. The entire contents of the above-referenced applications are hereby incorporated by reference.

BACKGROUND

Field

The present disclosure relates to micromechanical devices, and more particularly to etching methods for manufacturing micromechanical device layers from a device wafer. The present disclosure further concerns micromechanical devices which have been prepared with said etching methods.

Background of the Disclosure

Microelectromechanical (MEMS) systems typically comprise micromechanical parts which are formed in a device wafer by etching. The device wafer then forms the structural layer of the MEMS system where the micromechanical structures of the system are located. Some MEMS systems require moving micromechanical structures which are partly mobile in relation to the device wafer and fixed micromechanical structures which are immobile in relation to the same device wafer. MEMS systems with mobile micromechanical structures include acceleration sensors, gyroscopes, micromirrors, optical switches and scanners. The mobile micromechanical structures may include an inertial mass. In optical applications, the inertial mass may be coated with a reflective material to form a mirror.

An inertial mass may be suspended from fixed anchoring points by springs or suspenders. The springs or suspenders are sufficiently stiff to keep the mass in its designated movement region, but also sufficiently flexible to allow movement within this region. An inertial mass may be driven into motion by drive transducers which generate actuating forces. These transducers, which may also be called actuators, can be connected either directly to the inertial mass or to its suspenders. An inertial mass may also be moved by external forces. The movement of the inertial mass may be, but does not have to be, oscillatory movement.

The motion of an inertial mass may be sensed with sense transducers, which measure forces arising from the movement of the inertial mass. Drive and sense transducers may, for example, be capacitive or piezoelectric transducers. Sometimes the same transducer can be used both as a drive transducer and as a sense transducer.

Capacitive drive and sense transducers may comprise micromechanical structures such as interdigitated comb finger electrodes. Some of the fingers may be formed on a mobile inertial mass and may be called rotor fingers. Other fingers may be formed on fixed structures adjacent to the mobile inertial mass and may be called stator fingers. When connected to an electric circuit, rotor fingers and stator fingers may form a capacitive transducer. As the rotor fingers move, the capacitance between the rotor fingers and stator fingers changes, so capacitance measurements can be used to sense the movement of the rotor fingers, and thereby the movement of the inertial mass, when the transducer is used as a sense transducer. Conversely, a voltage applied to the finger electrodes can set the inertial mass in motion when the transducer is used as a drive transducer. Other electrode geometries, such as parallel plates, are also possible in capacitive drive and sense transducers.

The methods described in this disclosure relate to the manufacture of micromechanical structures which may, for example, be used to form capacitive transducer electrodes or piezoelectric actuators in MEMS systems. In this disclosure the term "micromechanical structures" refers to small, precisely patterned features in the measurement region of a MEMS device wafer. Since capacitive measurement requires close proximity, these small patterned features are typically manufactured on both sides of a narrow interface between a mobile component, such as an inertial mass, and a fixed component, such as a frame.

The micromechanical structures which form stator electrodes and rotor electrodes may be manufactured from the device wafer in one etching process. The device wafer may, for example, be a silicon wafer, and it may be supported by a much thicker handle wafer during processing. Etching is a critically important manufacturing process. Irregularities in the geometric pattern of the micromechanical structures can introduce measurement errors or cause short-circuits which entirely prevent measurement or actuation in the MEMS device.

An etching process may include many etching steps, and most device wafers undergo several process steps before they are complete. Etching typically requires that some parts of the device wafer surface are protected from the etchant by a mask material which is resistant to the etchant. The etchant should ideally remove material from the device wafer only in the vertical direction (perpendicular to the horizontal face of the wafer) in the regions which not covered by the mask. Multiple masks may be used, and they may be resistive to different etchants. In other words, an etchant which removes a first mask material, and then etches the wafer material underlying the first mask, may have no effect on a second mask material and the wafer material which underlies the second mask. Mask materials may be photoresistive materials where an etch-resistant area can be patterned with photolithographic methods. Photoresists and photolithographic methods can also be used to pattern other mask materials. In other words, photoresistive mask materials may used to pattern layers which have been deposited on top of a device wafer (in surface etching processes), but also to pattern the device wafer itself (in deep etching processes).

In some applications, the micromechanical structures which form rotors and stators may have high aspect ratios. For example, their width in the horizontal plane, which is parallel to one face of the device wafer, may be much smaller than their height in the vertical direction, which is perpendicular to the face of the device wafer. Vertical structures with high aspect ratios require deep trenches. Deep trenches can be difficult to etch because the etching process often begins to spread sideways in the horizontal direction as the etching proceeds.

This disclosure relates particularly to etching of device wafers which contain both level and recessed micromechanical structures. The meaning of the terms "level" and "recessed" in this disclosure will be explained with reference to FIG. 1. FIG. 1 shows a cross-section of a device wafer 11. The wafer may extend beyond the edges of the figure. Four micromechanical structures 12-15 are depicted in the middle of the figure.

The device wafer 11 has a first horizontal face 111 and a second horizontal face 112. The horizontal faces 111 and 112 define two xy-planes, and the vertical z-direction is perpendicular to these planes. The micromechanical structures 12-15 may, for example, be stator electrodes or rotor electrodes. The micromechanical structures 12-15 extend in the positive or negative y-direction, away from the xz-plane shown in FIG. 1. The micromechanical structures may be attached to an inertial mass or to a fixed frame at attachment points which are not illustrated in FIG. 1.

As seen in FIG. 1, the micromechanical structures 12-15 do not all have the same vertical height as the wafer in the z-direction, and their vertical heights are not all equal to each other. For the purposes of this disclosure, the following terminology will be adopted. Micromechanical structure 12 is a level structure with regard to first horizontal face 111. It is also a level structure with regard to second horizontal face 112. Micromechanical structure 13 is a recessed structure with regard to first horizontal face 111 and a level structure with regard to second horizontal face 112. Micromechanical structure 14 is a level structure with regard to first horizontal face 111 and a recessed structure with regard to second horizontal face 112. Micromechanical structure 15 is a recessed structure with regard to first horizontal face 111 and also a recessed structure with regard to second horizontal face 112.

In other words, a micromechanical structure is level with regard to a horizontal face of the device wafer if it extends to the xy-plane defined by that face. A micromechanical structure is recessed with regard to a horizontal face of the device wafer if it does not extend to the xy-plane defined by that face. At least one recession depth D, defined as the vertical distance from a horizontal face to the micromechanical structure, can be defined for each recessed structure. The recession depth D of micromechanical structure 13 with respect to horizontal face 111 is illustrated in FIG. 1. The benefit of using recessed rotors or stators in capacitive transducers include that they facilitate differential capacitive measurements where the capacitive response is a highly linear function of rotor displacement. Etching closely spaced high aspect ratio (HAR) micromechanical structures to different vertical depths can be challenging because the device wafer may have to be subjected to two consecutive deep etches: a first deep etch which defines the horizontal dimensions of both level and recessed micromechanical structures and at least begins the etching of the HAR structures, and a second deep etch which at least etches the recessed structures to their recession depth.

The HAR micromechanical structures formed in the first deep etch can easily be damaged in the second deep etch. HAR micromechanical structures are typically etched with deep reactive ion etching (DRIE), a process which proceeds in alternating sequences of etching and deposition. A polymer deposition step is followed by a polymer break-through step and an etching step. The etching step may comprise nearly isotropic plasma etching. A new polymer layer is deposited on the etched structure, and the polymer on the bottom of the trench or hole may be removed by ion sputtering before the next etching step is performed.

In the second deep etch, this DRIE process is carried out on pre-existing HAR micromechanical structures which are to be recessed. This often causes double masking effects which can create spikes on the upper edges of the recessed structure. The reason for this is that the polymer deposited on the recessed structure is incompletely removed from the edges of the recessed structure in the polymer break-through step. When polymer layers accumulate near the edges during multiple etching and deposition sequences, it can act like an etching mask and allow thin silicon spikes to form near the edges. This effect can be especially prominent if the narrow area lies adjacent to an open area with large horizontal dimensions.

FIG. 2 illustrates schematically a HAR micromechanical structure which has first been patterned in a first deep etch and then recessed in a second deep etch DRIE process. The illustrated micromechanical structure could, for example, be either of structures 13 or 15 in FIG. 1. In the second deep etch which creates the recess, the etch has acted more strongly in the middle area 22 than in the edge areas 23 and 24.

Silicon spikes 21 have thereby formed on both edges when the recesses micromechanical structure was recessed in the second etching step. FIG. 3 is a microscopy image of recessed micromechanical structures with visible spikes 31 in light grey colour on edges of the upper surface of each recessed micromechanical structure.

Spikes can short-circuit and disturb electrical measurements in microelectromechanical structures, especially if they break. Eliminating them is therefore a high priority. One way to eliminate spikes is to perform the second DRIE step aggressively, so that each etching step, in addition to proceeding strongly in the vertical direction, also removes silicon relatively strongly in the horizontal direction. An aggressive etch does not allow any spikes to form on the edges of the recessed structure.

However, aggressive etching can easily produce unwanted irregularities and damage on the vertical sidewalls which were produced in the first deep etch. Reference numbers 16-18 in FIG. 1 illustrate vertical sidewalls in HAR micromechanical structures. Sidewall damage can include striation, holes, and meshed areas from which pieces of silicon may detach under mechanical or thermal stress. These pieces can short-circuit the device and disturb electrical measurements. Even if a high quality smooth sidewall surface has been obtained in the first etching step, its quality can deteriorate significantly in the second step if the second deep etch is performed as an aggressive DRIE process. FIG. 4 illustrates a damaged sidewall holes on the bottom side of the micromechanical structures and striation on the sidewalls.

It is challenging to etch spike-free, high-aspect ratio recessed structures for MEMS devices while maintaining good sidewall quality. These challenges may sometimes pose design restrictions on MEMS devices since the risks of spike formation, sidewall damage and short-circuiting may have to be taken into account in the design.

BRIEF DESCRIPTION OF THE DISCLOSURE

An object of the present disclosure is to provide a method so as to overcome the above problems.

The objects of the disclosure are achieved by a method which is characterized by what is stated in the independent claims. The preferred embodiments of the disclosure are disclosed in the dependent claims.

The disclosure is based on the idea of protecting the vertical sidewalls formed in the first deep etch with a self-supporting etching mask before the second etching step. The portions of the self-supporting etching mask which have been deposited on the micromechanical structures which are to be recessed become partly free-standing vertical walls as the second deep etching step proceeds. These partly freestanding vertical walls facilitate the use of a gentle etch in the second step without spike-formation on the micromechanical structures which are recessed in this step.

BRIEF DESCRIPTION OF THE DRAWINGS

In the following the disclosure will be described in greater detail by means of preferred embodiments with reference to the accompanying drawings, in which

FIGS. 8-9 illustrate how the method described in the preceding embodiment may be used to form trenches in any area of the device wafer.

DETAILED DESCRIPTION

Figure 2:
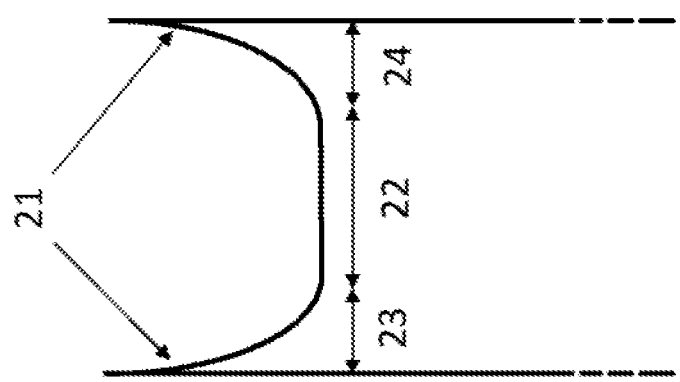
FIG. 2 illustrates spike formation in a HAR micromechanical structure.
Figure 1:
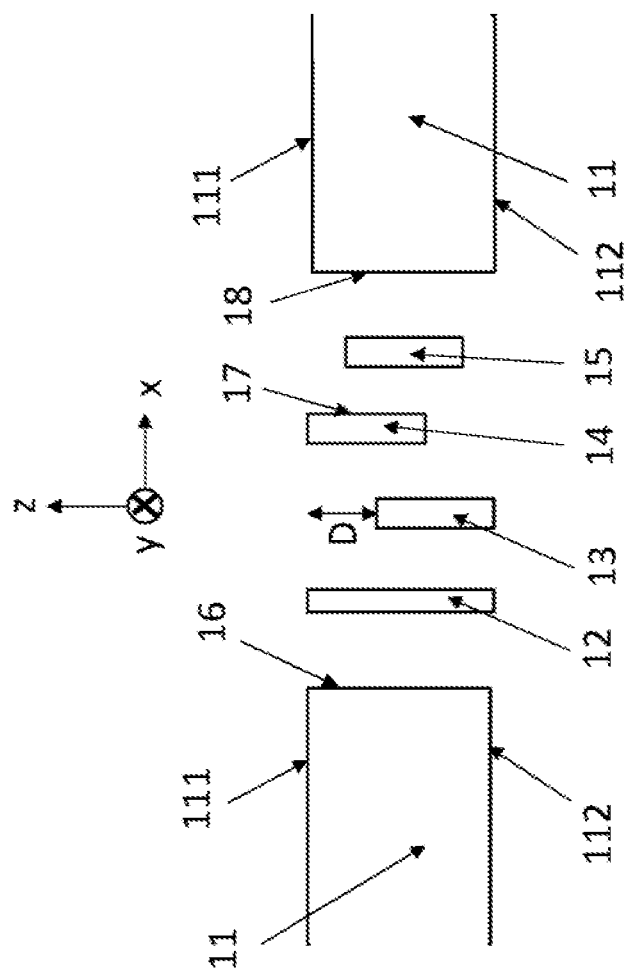
FIG. 1 illustrates level and recessed micromechanical structures.
Figure 4:
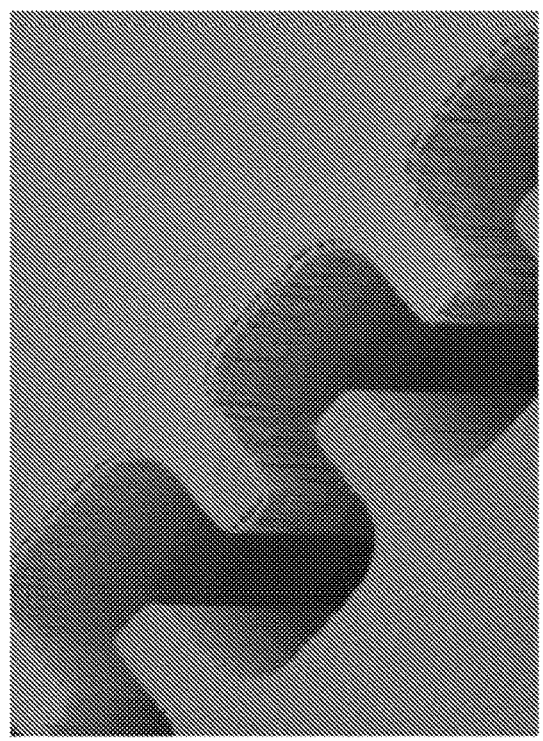
FIG. 4 is a microscopy image of the bottom side of a micromechanical structure.
Figure 3:
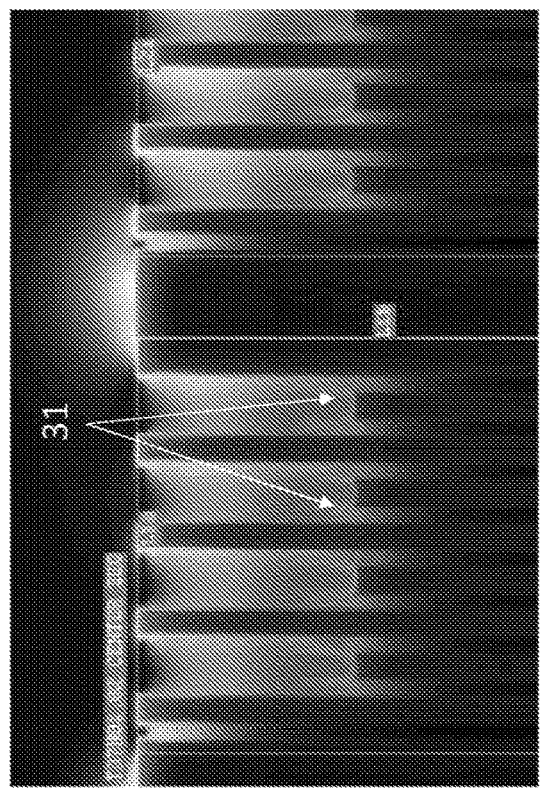
FIG. 3 is a microscopy image of recessed micromechanical structures with visible spikes.

In this disclosure, the term "level etching mask" means an etching mask which is deposited on a device wafer primarily (but not necessarily exclusively) to define the horizontal areas of the wafer which are to remain level during processing. These level horizontal areas may include both level micromechanical structures and larger areas of the device. A level etching mask is usually, but not necessarily always, deposited first on the device wafer, and removed last. The term "recess etching mask" means an etching mask which is deposited on a device wafer primarily (but not necessarily exclusively) to define the horizontal areas of the wafer which are to be recessed during processing. Recess etching masks may be deposited on top of a level etching mask, or partly on top of a level etching mask and partly on areas where the level etching mask has been removed.

In this disclosure, the term "self-supporting etching mask" means an etching mask which allows recessed structures to be etched in two or more sequential deep etching processes. Self-supporting etching masks facilitate sequential deep etching steps which do not cause spikes or sidewall damages. Self-supporting etching masks also allow a more diverse selection of etching methods to be used in the second and subsequent deep etches.

This disclosure relates to a method for manufacturing micromechanical structures in a device wafer, wherein the manufactured structures include at least one level micromechanical structure which is level with regard to a horizontal face of the device wafer, and at least one recessed micromechanical structure which is recessed with regard to the horizontal face of the device wafer.

The method comprises the step of patterning two or more etching masks on the horizontal face of the device wafer, wherein a level etching mask defines at least the horizontal dimensions of the level micromechanical structures, and one or more recess etching masks which define at least the horizontal dimensions of the recessed micromechanical structures.

The method further comprises the step of etching first vertical trenches in the regions of the device wafer which are not protected by either the first or the recess etching masks, and the step of removing one recess etching mask from the horizontal face of the device wafer.

The method further comprises the step of covering the horizontal face of the device wafer and the vertical sidewalls of the first vertical trenches with a self-supporting etching mask which is made of a self-supporting material, and the step of removing the self-supporting etching mask from the horizontal surfaces of the device wafer, so that the unprotected horizontal regions from which the self-supporting etching mask and the one recess etching mask were removed define the horizontal dimensions of recessed micromechanical structures.

The method further comprises the step of etching second vertical trenches in the unprotected regions, whereby the depth the second vertical trenches forms at least a part of the recess depth of a recessed micromechanical structure. The level etching mask and the self-supporting etching mask may then be removed from the device wafer, or, if recessed structure are to be etched to multiple depths, the process may be continued as described below.

Figures 5A, 5N:
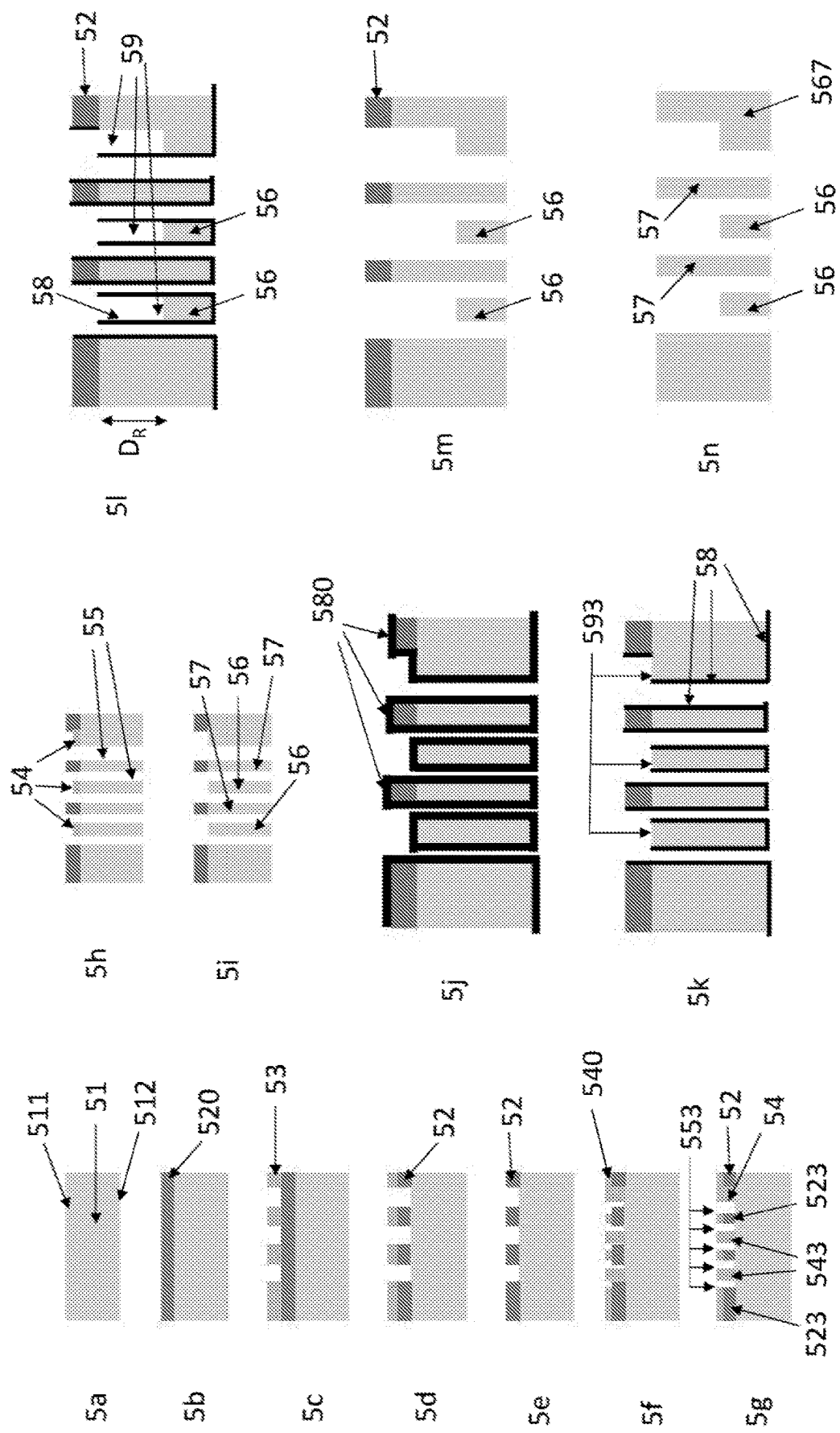
FIGS. 5a-5n illustrate a process sequence according to one embodiment.

FIGS. 5a-5n illustrate a process sequence according to one embodiment. FIG. 5a shows the initial device wafer 51, which may be a silicon wafer. The device wafer has a first horizontal face 511 and a second horizontal face 512. In FIG. 5b one horizontal face of the device wafer 51 is coated with a level etching mask material 520, which may, for example, be silicon dioxide, silicon nitride or aluminium. Etching mask materials are typically resistant to some etchants, but removable with other chemicals or etchants. The materials used in each etching mask must be taken into account when etchants are chosen for the etching steps described below.

A photoresistive material 53 may then be coated and patterned on the level etching mask material 520, as illustrated in FIG. 5c. A first surface etching step may remove the level etching mask material 520 from the regions left unprotected by the photoresistive pattern, so that a level etching mask 52 with the corresponding pattern is formed on the surface of the device wafer in FIG. 5d. The photoresistive material 53 has been stripped in FIG. 5e. In FIG. 5f a recess etching mask material 540 is coated and patterned on top of the level etching mask 52. This recess etching mask material may be the same photoresistive material as 53 in FIG. 5c above. As indicated in FIGS. 5f-5g, the level etching mask may be further patterned in a second surface etching step through the gaps in the recess etching mask material 540. FIG. 5g illustrates the resulting structure where the pattern of the level etching mask 52 and the recess etching mask 54 are vertically aligned in the areas where first and second vertical trenches are to be etched. Additional recess etching masks may be added with the same procedure.

In FIG. 5g, regions 553 on the horizontal face 511 are not protected by either the level etching mask 52 or the recess etching mask 54. Regions 523 are protected by the level etching mask 52 and regions 543 are protected by the recess etching mask 54. In the subsequent process steps, regions 553 define the first vertical trenches which are etched in the first deep etch, and regions 523 define the second vertical trenches which are etched in the second deep etch. Regions 523 will remain level in relation to the first horizontal face 511, regions 543 will be recessed in relation to the first horizontal face, and regions 553 will be etched all the way through the device wafer. If the number of recess etching masks is greater than one, the regions 543 may be determined by all the recess etching masks together, and the order in which the recess etching masks is removed may determine which one of the recessed micromechanical structures is recessed most, which one is recessed second most, and so on. FIGS. 5a-5n illustrate a process where only one recess etching mask is used.

In FIG. 5h, a first deep etch has been performed on the device wafer to form the first vertical trenches 55, which in this case extend all the way through the device wafer. The first deep etch may be a deep-reactive ion etch (DRIE) process performed on the first horizontal face of the device wafer. This DRIE may remove some of the recess etching mask material from the top of the level etching mask 52, as illustrated in FIG. 5h, but the recess etching mask 54 protects regions 543. In FIG. 5i the recess etching mask 54 has been removed from the horizontal face of the device wafer.

In FIG. 5i, micromechanical structures 57 are ones which are intended to remain level in relation to the first horizontal face 511, and micromechanical structures 56 are ones which are intended to be recessed in relation to the first horizontal face 511. As illustrated in FIG. 5j, a self-supporting etching mask 58 is deposited at least on the first horizontal face of the device wafer and on the vertical sidewalls. The self-supporting etching mask 58 may be deposited on the second horizontal face of the device wafer as well. The horizontal face of the device wafer and the vertical sidewalls of the first vertical trenches are thereby covered by the self-supporting etching mask.

The material of the self-supporting etching mask material is chosen so that the self-supporting etching mask becomes self-supporting when deposited to a sufficient thickness. In this disclosure, the term "self-supporting" means that when a self-supporting etching mask is deposited on a vertical sidewall, the mask becomes sufficiently rigid to remain standing vertically in the location where it was deposited even as the sidewall upon which it was deposited is etched away. In other words, the material of the device wafer forms may form an initial vertical sidewall on which the self-supporting etching mask material is deposited. When this material is gradually removed in a second deep etch, the self-supporting etching mask remains vertically standing on the location where the initial vertical sidewall stood.

The self-supporting etching mask material may, for example, be silicon dioxide, and it may for example be deposited in a chemical vapour deposition process where tetraethylorthosilicate (TEOS) is used as a precursor. Alternatively, the self-supporting etching mask material may be silicon dioxide or silicon nitride, deposited in a chemical vapour deposition process or spin-on-glass process. The material of the self-supporting etching mask may also be a metallic material such as aluminium, deposited in a PVD process. Other alternatives include polymers such as polyimide, or photoresists, deposited by vapour deposition or spray coating.

The thickness required of the self-supporting etching mask material for forming a self-supporting wall depends on the material which is used, but it may, for example, be in the range 0.1 µm-10 µm. The horizontal widths of micromechanical structures 56 and 57, which correspond to the distances between the sidewalls where the self-supporting etching mask material is deposited, may be as low as 0.1 µm. The horizontal widths of the first vertical trenches 55 may be as low as 0.3 µm, but they may also be very much larger, since micromechanical structures may be located next to large open areas.

In FIG. 5j, the self-supporting etching mask material 580 has been deposited on all sides of the device wafer. The self-supporting etching mask material 580 may then be partly removed, for example in a dry etching process performed on the first horizontal face of the device wafer, as illustrated in FIG. 5k. The self-supporting etching mask material is thereby removed from the horizontal surfaces of the device wafer which face in the same direction as the first horizontal face of the device wafer, as illustrated in FIG. 5n. Vertical sections of the self-supporting etching mask material will remain in place, although they may be thinned in the dry etching process. Self-supporting etching mask material may also remain on the second horizontal face of the device wafer. The remaining portions of self-supporting etching mask material now form the self-supporting etching mask 58. The regions 593 which are now unprotected on the first horizontal face of the device wafer are the regions from which the recess etching mask 54 was removed and from which the self-supporting etching mask material 580 was subsequently also removed. define the horizontal dimensions of the recessed micromechanical structures.

A second deep etch may then be performed on the first horizontal face of the device wafer to form second vertical trenches 59, as illustrated in FIG. 5l. The second vertical trenches are recess trenches and their depth in relation to the first horizontal face of the device wafer defines a recess depth $D_R$ for micromechanical structures 56 in relation to this face of the device wafer.

The self-supporting etching mask 58 remains standing even as the second vertical trenches 59 are etched, ensuring that the recessed micromechanical structures 56 are formed without spikes. The self-supporting etching mask 58 also protects the sidewalls in the first vertical trenches 55 from being damaged during the second deep etch.

The second deep etch may be a DRIE process like the first deep etch, and it may be an aggressive DRIE process because the self-supporting etching mask 58 protects the sidewalls. However, the self-supporting etching mask 58 also allows other methods to be used for the second and subsequent deep etches, such as isotropic dry etching or wet etching. If the material of the device wafer is silicon, the wet etching may be performed with KOH/TMAH etchants.

As illustrated in FIG. 5m, after the second vertical trenches have been etched to their desired depth, the third mask 58 may be removed. The level etching mask 52 may thereafter also be removed, which produces the device structure illustrated in FIG. 5n, with recessed micromechanical structures 56 and level micromechanical structures 57. Some parts of the device, such as part 567 in FIG. 5n, may comprise a recessed structure and a level structure joined together, where the recessed structure forms a separate ledge at the recession depth $D_R$.

In the example illustrated in FIGS. 5a-5n, the first vertical trenches were etched in FIG. 5h with a deep-reactive ion etch (DRIE) which proceeds through the entire device wafer 51, from the first horizontal face 511 to the second horizontal face 512. However, the method described in this disclosure can also be employed by etching the first vertical trenches initially only to an initial first vertical trench depth $D_T$, which is less than the thickness of the device wafer. Spike formation can be prevented and good sidewall quality can be maintained even if the first vertical trenches are not initially etched through the entire thickness of the device wafer. First vertical trenches are in this case etched in a deep-reactive ion etch process to an initial first vertical trench depth, and the first vertical trenches are then etched deeper in a subsequent deep etch process where the second vertical trenches are etched simultaneously.

Figures 6A, 6B, 6C, 6D, 6E, 6F:
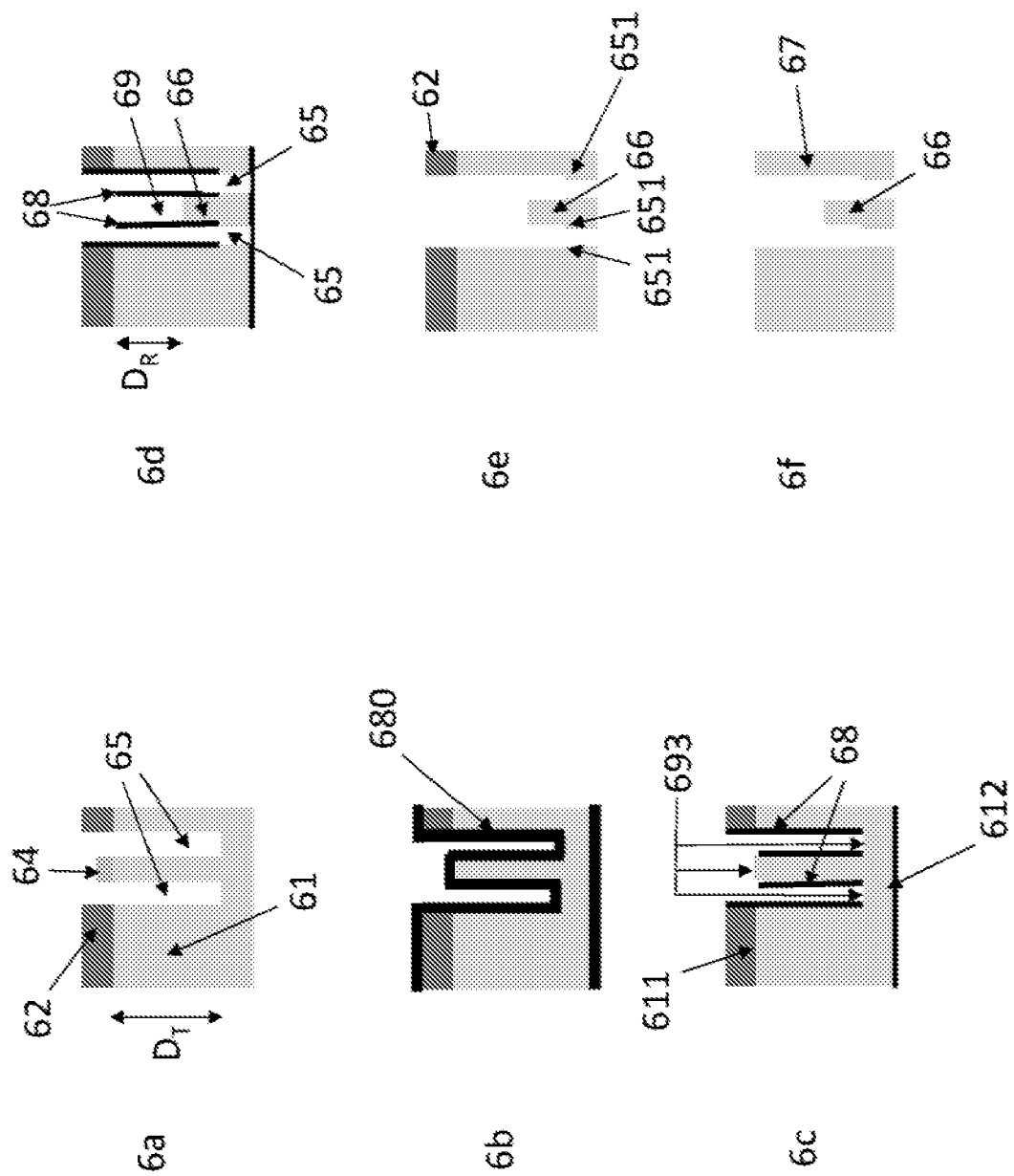
FIGS. 6a-6f illustrate a process sequence according to another embodiment.

FIGS. 6a-6e illustrate a method where the first vertical trenches are initially etched in a first deep etch process only to an initial first vertical trench depth $D_T$, which is less than the thickness of the device wafer. FIG. 6a shows the device wafer 61, the level etching mask 62, the recess etching mask 64 and the first vertical trenches 65. The process steps preceding the stage illustrated in FIG. 6a are the same ones which were illustrated in FIGS. 5a-5g. The first vertical trenches 65 in FIG. 6a are etched to an initial first vertical trench depth $D_T$, and then first etch is stopped. The recess etching mask 64 may then be removed, and the self-supporting etching mask material 680 may be deposited on all sides of the device wafer 61, as illustrated in FIG. 6b. The self-supporting etching mask material is a self-supporting material.

The self-supporting etching mask material 680 may then be partly removed, for example in a dry etching process which removes the material 680 from the horizontal surfaces of the device wafer which face in the same direction as the first horizontal face of the device wafer, as illustrated in FIG. 6c. Vertical sections of the self-supporting etching mask material will remain in place, although they may have been thinned by the dry etching process. Self-supporting etching mask material may also remain on the second horizontal face 612 of the device wafer. These remaining portions of self-supporting etching mask material now form the self-supporting etching mask 68. The unprotected regions 693 correspond to the horizontal dimensions of the first vertical trenches 65 which were recessed to the initial first vertical trench depth $D_T$ in the first deep etch, and also the horizontal dimensions of the micromechanical structures 66 which will be recessed in the second deep etch.

As FIG. 6d illustrates, a second deep etch may then be performed on the first horizontal face 611 of the device wafer to form second vertical trenches 69, which are recess trenches for recessed micromechanical structures 66. Their depth defines a recess depth $D_R$ of micromechanical structure 66 in relation to the first face 611 of the device wafer. The second deep etch also continues the etching of first vertical trenches 65, extending their depth deeper into the device wafer. After the second deep etch, the first vertical trenches 65 may extend through the entire device wafer, as illustrated in FIG. 6d. The second deep etch may be a DRIE process.

The self-supporting etching mask 68 remains standing as a vertical mask wall even as the second vertical trenches 69 are etched. As before, this ensures that the recessed micromechanical structures 66 can be etched aggressively without sidewall damage. The recess trenches can thereby be formed without spikes. The self-supporting etching mask 68 also protects the sidewalls in the first vertical trenches 65 to the initial first vertical trench depth $D_T$.

As illustrated in FIG. 6e, after the second vertical trenches 69 have been etched to their desired depth, and first vertical trenches 65 have been etched all the way through the device wafer, the third mask 68 may be removed. The level etching mask 62 may thereafter also be removed, which produces the device structure illustrated in FIG. 6f, with recessed micromechanical structures 66 and level micromechanical structures 67. Some parts in the device wafer may comprise a recessed structure and a level structure joined together, where the recessed structure forms a ledge.

In FIG. 6c, the third mask 68 on the sidewalls of the first vertical trenches 65 makes the horizontal width of the unprotected region 693 in the first vertical trenches 65 slightly narrower than the initial width of the first vertical trenches 65 after the first deep etch. The second deep etch therefore acts on a slightly narrower area in first vertical trenches 65 than the first deep etch did. The second deep etch may therefore leave a small bump 651 on each sidewall of the first vertical trench at the initial first vertical trench depth $D_T$, as illustrated in FIGS. 6e and 6f.

Utilizing the same method as described above, it is also possible to produce micromechanical structures which are recessed to several different recession depths from the first horizontal face of the device wafer. If the micromechanical structures are to be recessed to two different depths in relation to the first horizontal face of the device wafer 511 in FIGS. 5a-5n, the number of recess etching masks 54 may be increased to two. For the purposes of this disclosure, these two recess etching masks may be called first recess etching mask A and second recess etching mask B. They should be made of different materials or different thicknesses, so that at least one of them is resistant to the etchant which removes the other. The first and second recess etching masks A and B may be deposited and patterned separately.

More generally, the number of recess etching masks may be an integer N which is greater than one. After the second deep etch process, but before the level etching mask and the self-supporting etching mask are removed, the following steps may be repeated N−1 times to manufacture recessed micromechanical structures etched to N different recess depths: I) one recess etching mask or a part of the level etching mask is removed from the horizontal face of the device wafer, and II) vertical trenches are etched in the unprotected horizontal regions in a third deep etching step (and subsequent deep etching steps if N>3), whereby the depth of the vertical trenches forms at least a part of the recess depth of a recessed micromechanical structure. In step I), the mask which is removed may be a recess etching mask if the recess etching mask was deposited directly onto the device wafer, as illustrated in FIG. 7e. If, on the other hand, the recess etching mask is patterned onto the level etching mask, as illustrated in FIGS. 10c-10e, then the mask which is removed in this step may be the level etching mask.

Figures 7A, 7Q:
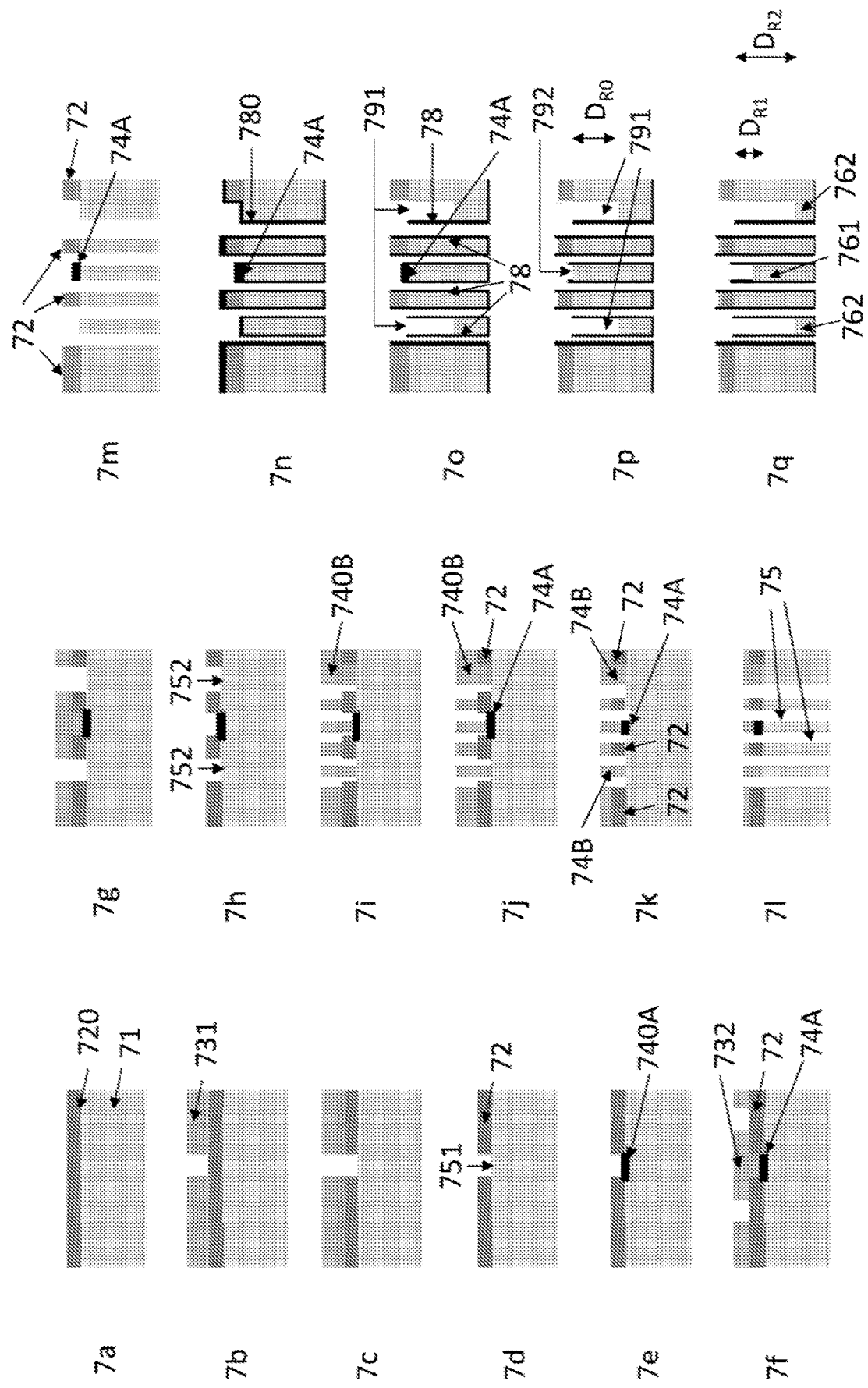
FIGS. 7a-7q illustrate a process sequence according to another embodiment.

FIGS. 7a-7q illustrate one method for etching micromechanical structures recessed to multiple levels in more detail. FIG. 7a shows a device wafer 71 covered by level etching mask material 720, which may be patterned layer of silicon dioxide. This material is patterned into a level etching mask 72 with the help of patternable photoresistive material 731. These steps correspond to the ones illustrated earlier in FIGS. 5a-5e, but it is noted that level etching mask 72 may be prepared as a thicker layer in the method illustrated in FIGS. 7a-7q than in the earlier method. The layer of level etching mask material 720 may be characterized as a thick silicon dioxide layer in comparison to the layer of first recess etching mask material 740A described below.

In FIG. 7e, the gap 751 which was formed in the level etching mask 72 is filled with a layer of first recess etching mask material 740A. The gap (there may of course be multiple gaps) 751 defines the horizontal area where the first recess etching mask is to be placed. This layer will eventually form first recess etching mask 74A. Even though layer 740A has been drawn for illustrative purposes with a colour which differs from the color of layers 720 and 72, the first recess etching mask material 740A may in this case be the same material as level etching mask material 720, for example silicon dioxide. The main difference between material layers 740A and 720 is their thickness. The layer of first recess etching mask material 740A may be characterized as a thin silicon dioxide layer in comparison to the layer of level etching mask material 720. Level etching mask 72 grows a bit thicker when first recess etching mask material 740A is deposited.

In FIGS. 7f-7h, a new layer of photoresistive material 732 is patterned on top of level etching mask 72 and on first recess etching mask 74A. After the patterning which produces gaps 752 in the level and recess etching masks, the level etching mask 72 and recess etching mask 74A together define at least the horizontal dimensions of level micromechanical structures and the horizontal dimensions of micromechanical structures which will be recessed to a first, lower recession depth $D_{R1}$.

In FIG. 7i, a second recess etching mask material 740B is deposited and patterned on the device wafer. This second recess etching mask material may be the same photoresistive material as 731 in FIG. 7b and 732 in FIG. 7f. As indicated in FIGS. 7j-7k, the level etching mask 72 and first recess etching mask 74A may be further patterned in another surface etching step through gaps in the second recess etching mask material 740B. In the resulting structure the pattern of the level etching mask 72 and recess etching masks 74A and 74B are vertically aligned in the areas where first and second vertical trenches are to be etched.

In FIG. 7l, a first deep etch has been performed to produce first vertical trenches 75. This first deep etching process may correspond to the one which was described with reference to FIGS. 5a-5n. In FIG. 7m, second recess etching mask 74B has been removed, so that only level etching mask 72 and first recess etching mask 74A remain.

In FIG. 7n self-supporting etching mask material 780 has been deposited on all sides of the device wafer. As before, the self-supporting etching mask material 780 may then be removed from the horizontal surfaces of the device wafer which face in the same direction as the first horizontal face of the device wafer. The resulting self-supporting etching mask 78 is illustrated in FIG. 7o. The self-supporting etching mask functions in the manner which was described above with reference to FIGS. 5a-5n, so that vertical sections of the self-supporting etching mask material remain in place and guide the second deep etch. However, the process depicted in FIGS. 7a-7q differs from the one depicted in FIGS. 5a-5n in that a third deep etch is performed after the second deep etch.

In FIG. 7o, the second deep etch has been performed on the horizontal areas 791 which were left unprotected after the self-supporting etching mask material 780 was removed from the horizontal surfaces to form second vertical trenches. But first recess etching mask 74A still protects some of the areas which will later become recessed micromechanical structures. The second vertical trenches 791 may be etched to an initial recess depth $D_{R0}$ in the second deep etch. This initial recess depth differs from their final recess depth.

In FIG. 7p, first recess etching mask 74A has been removed from horizontal surface 792. This removal may be carried out in a surface etching steps which removes mask material both from the first recess etching mask 74A and from the level etching mask 72. However, because the first recess etching mask 74A is thinner than the level etching mask 72, the surface etching, if stopped at the right moment, will remove the first recess etching mask 74A entirely while still leaving a sufficiently thick protective layer in level etching mask 72.

In FIG. 7q, a third deep etch has been performed, this time on the horizontal areas 791 and 792 which were left unprotected after the first recess etching mask 74A was removed. In other words, this third deep etch continues the etching which was started in the second deep etch in areas 791, and starts a new deep etch in the area 792. The third deep etch may be a DRIE process, dry etching process or wet etching process.

The result, after all remaining etching masks have been removed, is a device which includes level micromechanical structures as well as first recessed micromechanical structures 761 with a recess depth $D_{R1}$, and second recessed micromechanical structures 762 with a different recess depth $D_{R2}$. The recessed depth $D_{R2}$ is determined by the relation $D_{R2}=D_{R0}+D_{R1}$.

The same process, where a thick oxide is used as the level etching mask, a thin oxide as one first recess etching mask A, and a photoresistive material as the second recess etching mask B, may be used to form recessed areas that are wider than the first vertical trenches. This is schematically illustrated in FIGS. 8-9. FIG. 8 shows a device wafer with a level etching mask 82 covering areas which are to remain level, first recess etching mask 84A covering an area where a recessed area will be formed, and second recess etching mask 84B covering areas where recessed micromechanical structures will be formed. FIG. 9 illustrates the structure after the etchings have been performed, with level micromechanical structures 87, recessed micromechanical structures 86 and the recessed area 88. The process steps correspond to the ones explained above with reference to FIGS. 7a-7q. The recessed area 88 may be much wider in comparison to the micromechanical structures than FIGS. 8-9 schematically illustrate. It may, for example, be 50-100 μm wide, while the width of the micromechanical structures 86 and 87 and vertical trenches 85 may be only a few micrometers.

Figures 10A, 10S:
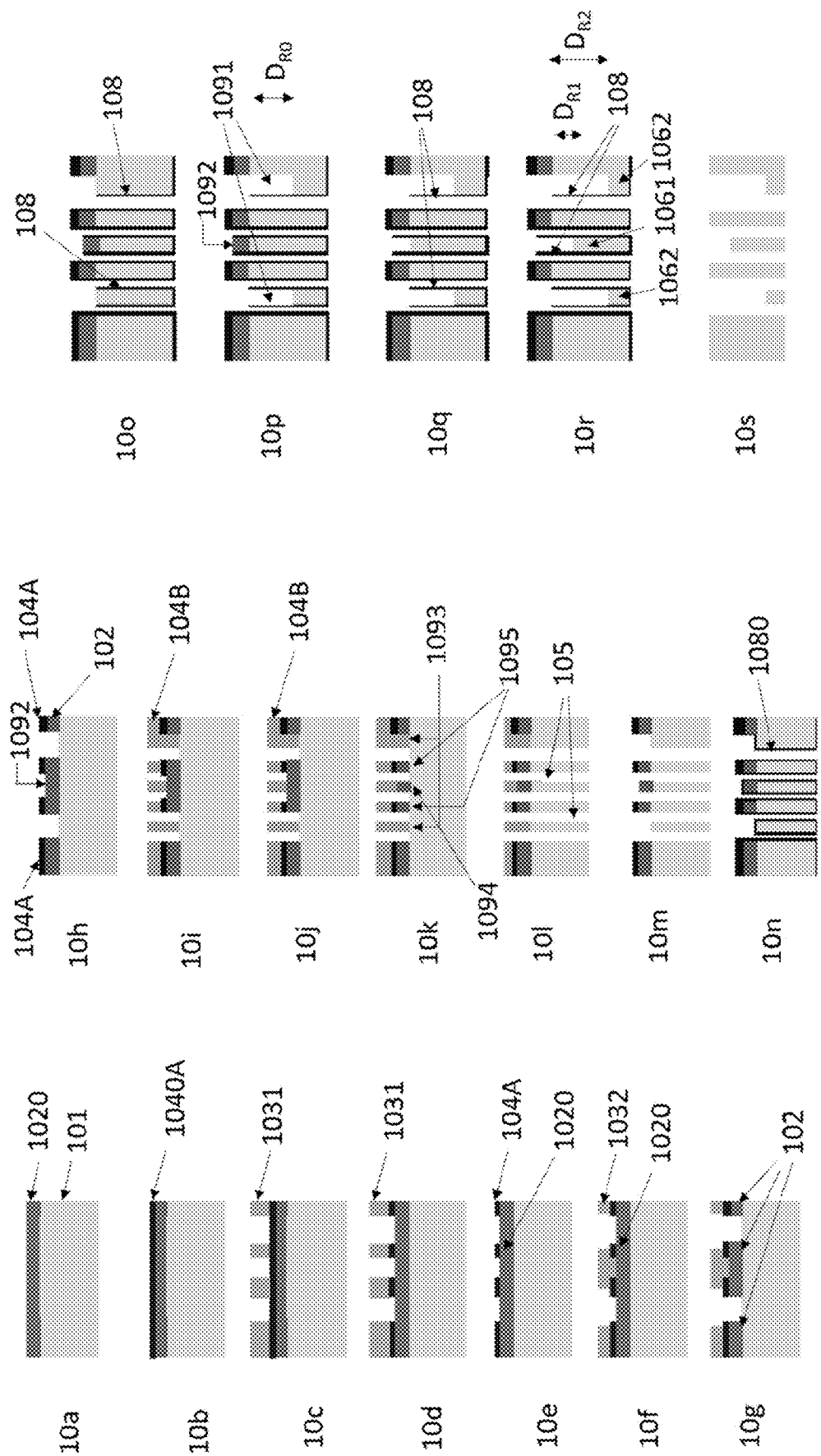
FIGS. 10a-10s illustrate a process sequence according to another embodiment.

FIGS. 10a-10s illustrate another method for etching micromechanical structures recessed to multiple levels. In this method the first recess etching mask material A is metallic, for example aluminium. A layer of level etching mask material 1020, which is deposited on device wafer 101 in FIG. 10a, may again comprise a thick silicon dioxide layer, as in the previous example. In FIG. 10b, a layer of first recess etching mask material 1040A is deposited on top of the layer of level etching mask material before the level etching mask has been patterned. The layer of first recess etching mask material 1040A may comprise aluminium.

In FIGS. 10c-10e, the layer of first recess etching mask material 1040A is patterned in a dry etching process with the help of a patterned layer of photoresistive material 1031 which has been removed in FIG. 10e. The first recess etching mask 104A has thereby been formed on top of the layer of level etching mask material 1020. The first recess etching mask material 1040A may alternatively be patterned with a liftoff process (not illustrated).

In FIGS. 10e-10f the level etching mask material 1020 is patterned in a surface etching process with the help of a patterned layer of photoresistive material 1032. Level etching mask 102 is thereby also patterned on the first horizontal face of the device wafer. In FIG. 10h, where the layer of photoresistive material 1032 has been removed, the device wafer is partly covered by the level etching mask 102, and the level etching mask is in turn partly covered by first recess etching mask 104A. In other words, there is a region 1092 on the level etching mask 102 which is not covered by first recess etching mask 104A.

In FIG. 10*i* another second recess etching mask 104B has been deposited on the first horizontal face of the device wafer and patterned with photolithographic methods. The material of this second recess etching mask may be a photoresistive material. In FIG. 10*j*, a surface aluminium etch has been performed to align the two second masks 104A and 104*b* with each other, and in FIG. 10*k* a surface oxide etch has been performed to align the first mask 102 with the two second masks 104A and 104B.

In FIG. 10*k*, unprotected areas define the horizontal dimensions of the first vertical trenches, which are in this case etched all the way through the device wafer in the first deep etch. Areas protected only by second recess etching mask 104B, such as the areas 1093, define the horizontal dimension of micromechanical structures which will first be etched to an initial recess depth $D_{R0}$ in the second deep etch, and then to a deeper recess depth in the third deep etch. Areas protected by the level etching mask 102 and second recess etching mask 104B, but not by first recess etching mask 104A, such as areas 1094 in FIG. 10*k*, define the horizontal dimensions of micromechanical structures which will be etched to a recess depth in the third deep etch. Finally, areas protected by the level etching mask 102 and also by both recess etchings masks 104A and 104B, such as areas 1095 in FIG. 10*k*, define the horizontal dimensions which will remain level.

FIG. 10*l* illustrates the device wafer after the first deep etch has been performed and first vertical trenches 65 have been formed. In FIG. 10*m*, second recess etching mask 104B has been removed. A self-supporting etching mask material 1080 is then deposited on the surfaces of the device wafer, as illustrated in FIG. 10*m*. As in the earlier examples, the self-supporting etching mask material 1080 is removed from the horizontal surfaces on the first horizontal face of the device wafer, leaving self-supporting etching mask 108 in place to protect the vertical sidewalls of the first vertical trenches, and to from vertical sidewalls on the recessed micromechanical structures.

As indicated in FIG. 10*o*, the areas previously protected by second recess etching mask 104B are now unprotected. FIG. 10*p* illustrates the device wafer after the second deep etch has been performed and second vertical trenches 1091 have been etched to an initial recess depth $D_{R0}$.

The first recess etching mask 104A was not deposited in region 1092, as illustrated in FIG. 10*p*. A surface etch can therefore now be performed to remove the level etching mask material from this region. The first recess etching mask 104A protects the other parts of the level etching mask during this surface etch. In FIG. 10*q* the level etching mask material has been removed from the region 1092, leaving an unprotected region of the device wafer in its place. A third deep etch may then be performed, as illustrated in FIG. 10*r*, to form first recessed micromechanical structures 1061 with a recess depth $D_{R1}$, and second recessed micromechanical structures 1062 with a different recess depth $D_{R2}$. The recessed depth $D_{R2}$ is again determined by the relation $D_{R2}=D_{R0}+D_{R1}$. FIG. 10*s* illustrates the device wafer after all etching masks have been removed. The device comprises recessed structures which have been recessed to two different recess depths, as well as level structures.

Some materials which could be used for the second recess etching mask 104B may become slightly eroded in the etching step between FIGS. 10*j* and 10*k*, where the second recess etching mask is used for clearing the areas where the first vertical trenches 105 are to be etched. Erosion in the second recess etching mask 104B may lead to imprecisely etched first vertical trenches, which can produce inaccuracies in the measured capacitance.

FIGS. 11*a*-11*h* illustrate an alternative method which can be used if the material of the second recess etching mask is sensitive to erosion in the situation described above. The materials of the level etching mask 112 and recess etching masks 114A and 114B in FIGS. 11*a*-11*h* may be the same ones as the materials of masks 102, 104A and 104B, respectively, in the example illustrated in FIGS. 10*a*-10*s*. The first recess mask 114A, which may be made of aluminium, can be patterned by dry etching or a liftoff process. The process steps illustrated in FIGS. 11*a*-11*b* correspond to the ones illustrated in FIGS. 10*a*-10*e*, However, in this case the surface etch which defines the areas 1095 where first vertical trenches are to be etched is performed already in FIG. 11*c* based on the pattern of the first recess etching mask 114A, before the second recess etching mask has been deposited.

Figures 11A, 11B, 11C, 11D, 11E, 11F, 11G, 11H:
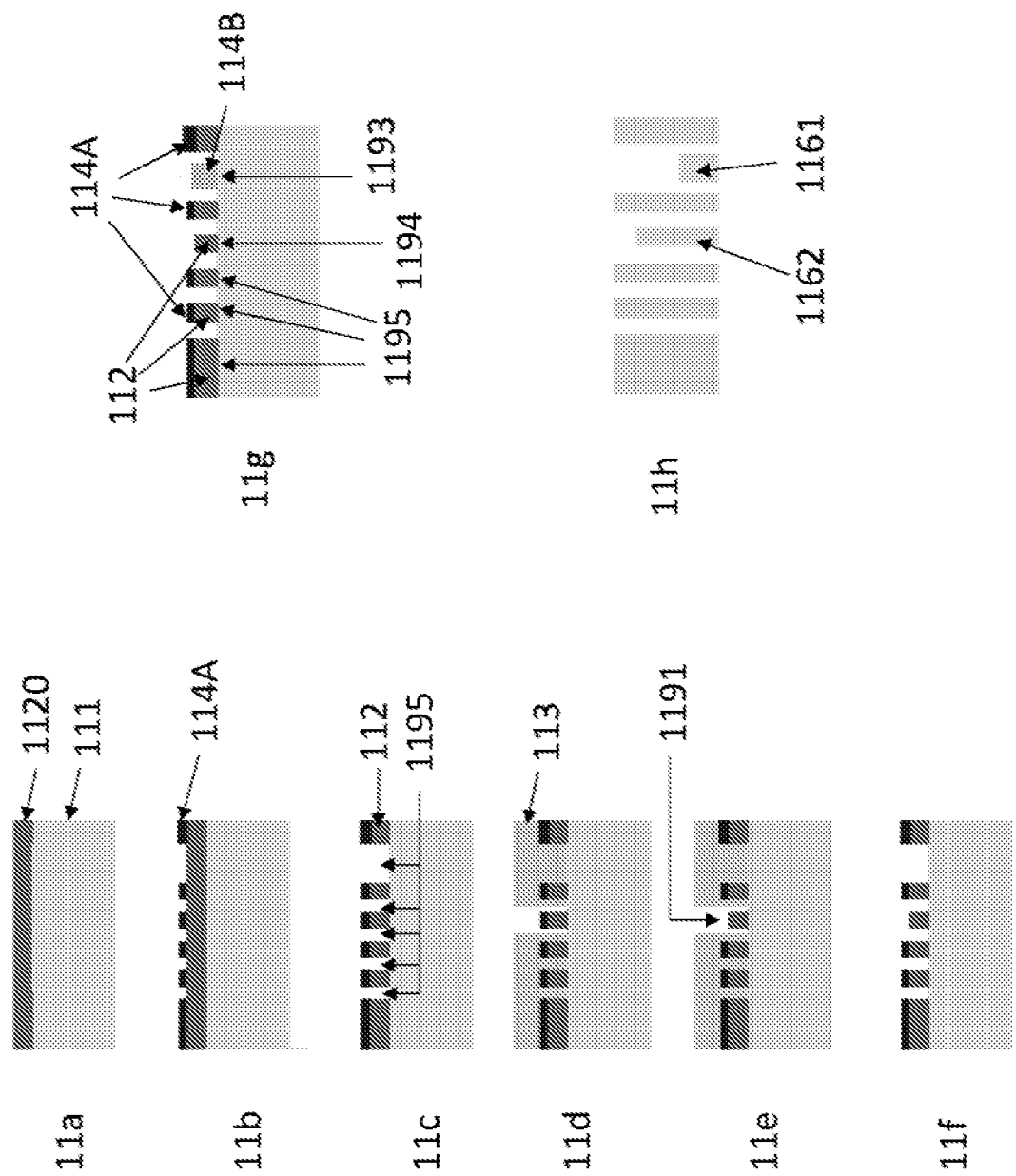
FIGS. 11a-11h illustrate a process sequence according to another embodiment.

In FIG. 11*d* a photoresistive material 113 is then deposited and patterned on the device wafer 111, and a part of the first recess etching mask 114A is removed with a surface etch from the unprotected area 1191, as illustrated in FIG. 11*e*. This surface etch may, for example, be a wet etching or dry etching process. The photoresist 113 may then be removed, as illustrated in FIG. 11*f*, and the second recess etching mask 114B, which may also be a photoresistive material, can then be patterned on the device substrate. This results in the structure illustrated in FIG. 11*g*.

In FIG. 11*g*, unprotected areas define the horizontal dimensions of the first vertical trenches, which may be etched all the way through the device wafer 111 in the first deep etch. Areas protected only by second recess etching mask 114B, such as area 1193, define the horizontal dimension of micromechanical structures which will first be etched to an initial recess depth $D_{R0}$ in the second deep etch, and then to a deeper recess depth in the third deep etch. Areas protected only by the level etching mask 112, such as area 1194 in FIG. 11*g*, define the horizontal dimensions of micromechanical structures which will be etched to a recess depth in the third deep etch. Finally, areas protected by the level etching mask 112 and also by first recess etching masks 114A and, such as areas 1195 in FIG. 11*g*, define the horizontal dimensions which will remain level.

The etching process then proceeds in the same manner as in the preceding embodiment. In other words, a first deep etch is performed to etch first vertical trenches, second recess etching mask 114B is removed, and a self-supporting etching mask is then deposited. After that a second deep etch is performed in area 1193. The part of the level etching mask 112 which is not protected by first recess etching mask 114A is then removed from area 1194, and a third deep is performed on areas 1193 and 1194 simultaneously to complete the recess trenches. These steps have not been separately illustrated in the Figures. FIG. 11*h* illustrates the completed micromechanical device structures, where micromechanical structures 1161 and 1162 have been recessed to different depths.

In any of the embodiments presented in FIGS. 5*a*-5*n*, 6*a*-6*f*, 7*a*-7*q*, 8, 9, 10*a*-10*s* and 11*a*-11*h*, the recess depths (such as $D_{R0}$, $D_{R1}$ and $D_R$) of the second vertical trenches may, for example, be greater than 5 µm, greater than 10 µm, greater than 15 µm, or greater than 20 µm.

The recess depths may lie in a range which extends from 5 µm to 99% of the thickness of the substrate. If, for example, the device wafer is 50 µm thick, the recess depths may lie in the range 5 µm to 49.5 µm. Alternatively, the recess depths may lie in a range which extends from 5 µm to 95% of the thickness of the substrate, or from 10 μm to 95% of the thickness of the substrate. The deeper the recess depth, the greater is the risk of spiking-related problems if self-supporting etching masks are not used.

In any of the embodiments presented in FIGS. 5a-5n, 6a-6f, 7a-7q, 8, 9, 10a-10s and 11a-11h, the height-to-width aspect ratio (height in the vertical direction divided by width in the horizontal plane) of the second vertical trenches may, for example be greater than 2, greater than 3, greater than 5, greater than 10, greater than 15, greater than 25, or greater than 40. Increasing the aspect ratio of a second vertical trench increases the risk of spiking-related problems if self-supporting etching masks are not used.

In any of the embodiments presented in FIGS. 5a-5n, 6a-6f, 7a-7q, 8, 9, 10a-10s and 11a-11h, the level micromechanical structures and the recessed micromechanical structures may after etching exhibit aspect ratios (between height in the vertical direction and width in the horizontal plane) as high as 500. Alternatively, their aspect ratio may for example lie in the range 5-50, or 10-40.

In any of the embodiments illustrated in FIGS. 7a-7q, 8-9, 10a-10s and 11a-11h, the number of recess etching masks A, B, C . . . can be increased if micromechanical structures are to be recessed to more than two separate recess depths.

The methods described above may also be used to etch micromechanical structures which are recessed in relation to both horizontal faces of the device wafer, or devices where some recessed micromechanical structures are recessed in relation to the first horizontal face, and other recessed micromechanical structures are recessed in relation to the second horizontal face. This requires masking of the second horizontal face of the device wafer as well, and second deep etches need to be performed on both faces of the device wafer.

The invention claimed is:

1. A method for manufacturing micromechanical structures in a device wafer, wherein the manufactured structures include at least one level micromechanical structure which is level with regard to a horizontal face of the device wafer, and at least one recessed micromechanical structure which is recessed with regard to the horizontal face of the device wafer, and the method comprises the steps of:
   a) patterning two or more etching masks on the horizontal face of the device wafer, wherein a level etching mask defines at least the horizontal dimensions of the level micromechanical structures, and one or more recess etching masks which define at least the horizontal dimensions of the recessed micromechanical structures,
   b) etching first vertical trenches in the regions of the device wafer which are not protected by either the level or recess etching masks,
   c) removing one recess etching mask from the horizontal face of the device wafer,
   d) covering the horizontal face of the device wafer and the vertical sidewalls of the first vertical trenches with a self-supporting etching mask which is made of a self-supporting material,
   e) removing the self-supporting etching mask from horizontal surfaces of the device wafer, so that the unprotected horizontal regions from which the self-supporting etching mask and one recess etching mask were removed define the horizontal dimensions of recessed micromechanical structures,
   f) etching second vertical trenches in the unprotected horizontal regions, whereby the depth of the second vertical trenches forms at least a part of the recess depth of a recessed micromechanical structure, and
   g) removing the level etching mask and the self-supporting etching mask from the device wafer,
   wherein the first vertical trenches are etched in a deep-reactive ion etch process to an initial first vertical trench depth, and the first vertical trenches are then etched deeper in a subsequent deep etching process where second vertical trenches are etched simultaneously, and
   the height-to-width aspect ratio of the second vertical trenches is greater than 2.

2. A method according claim 1, wherein the material of the self-supporting mask is silicon dioxide.

3. A method according to claim 1, wherein the material of the self-supporting mask is silicon nitride.

4. A method according to claim 1, wherein the material of the self-supporting mask is a metallic material.

5. A method according to claim 1, wherein the material of the self-supporting mask is a polymer.

6. A method according to claim 1, wherein the subsequent etch process is also a deep-reactive ion etch process.

7. A method according to claim 1, wherein the number of recess etching masks is an integer N which is greater than one, and that, before proceeding to step g), the following steps f2)-f3) are repeated N−1 times to manufacture recessed micromechanical structures etched to N different recess depths:
   f2) removing one recess etching mask from the horizontal face of the device wafer, and
   f3) etching vertical trenches in the unprotected horizontal regions, whereby the depth of the vertical trenches forms at least a part of the recess depth of a recessed micromechanical structure.

8. A method according to claim 7, wherein the level etching mask is a patterned thick layer of silicon dioxide, a first recess etching mask is a patterned thin layer of silicon dioxide, and a second recess etching mask is a patterned layer of photoresistive material.

9. A method according to claim 1, wherein the number of recess etching masks is an integer N which is greater than one, and that, before proceeding to step g), the following steps f2)-f3) are repeated N−1 times to manufacture recessed micromechanical structures etched to N different recess depths:
   f2) removing a part of the level etching mask from the horizontal face of the device wafer, and
   f3) etching vertical trenches in the unprotected horizontal regions, whereby the depth of the vertical trenches forms at least a part of the recess depth of a recessed micromechanical structure.

10. A method according to claim 9, wherein the level etching mask is a patterned thick layer of silicon dioxide, a first recess etching mask is a patterned metallic layer, and a second recess etching mask is a patterned layer of photoresistive material.

* * * * *